US008571249B2

(12) United States Patent
Wang

(10) Patent No.: US 8,571,249 B2
(45) Date of Patent: Oct. 29, 2013

(54) SILICON MICROPHONE PACKAGE

(75) Inventor: Yunlong Wang, Sunnyvale, CA (US)

(73) Assignee: General MEMS Corporation, Sunnyvale, CA (US)

( * ) Notice: Subject to any disclaimer, the term of this patent is extended or adjusted under 35 U.S.C. 154(b) by 402 days.

(21) Appl. No.: 12/786,723

(22) Filed: May 25, 2010

(65) Prior Publication Data

US 2010/0303271 A1 Dec. 2, 2010

Related U.S. Application Data

(60) Provisional application No. 61/182,587, filed on May 29, 2009.

(51) Int. Cl.

| | |
|---|---|
| ***H04R 9/08*** | (2006.01) |
| ***H04R 11/04*** | (2006.01) |
| ***H04R 25/00*** | (2006.01) |
| ***H01L 23/12*** | (2006.01) |

(52) U.S. Cl.
USPC ........... 381/355; 381/174; 381/175; 381/361; 257/704

(58) Field of Classification Search
USPC ........................... 381/355, 174, 361; 257/704
See application file for complete search history.

(56) References Cited

U.S. PATENT DOCUMENTS 6,088,463 A * 7/2000 Rombach et al. ............. 381/174
6,522,762 B1 * 2/2003 Mullenborn et al. ......... 381/174
6,781,231 B2 * 8/2004 Minervini ..................... 257/704
6,945,115 B1 * 9/2005 Wang .............................. 73/718
7,434,305 B2 * 10/2008 Minervini ....................... 29/594
7,439,616 B2 * 10/2008 Minervini ..................... 257/704
7,447,323 B2 * 11/2008 Mullenborn et al. ......... 381/174
7,537,964 B2 * 5/2009 Minervini ..................... 438/113
7,692,288 B2 * 4/2010 Zhe et al. ...................... 257/704
7,812,418 B2 * 10/2010 Hsu et al. ...................... 257/419
7,939,932 B2 * 5/2011 Martin .......................... 257/690
8,018,049 B2 * 9/2011 Minervini ..................... 257/704
8,199,939 B2 * 6/2012 Suvanto et al. ............... 381/175
8,243,962 B2 * 8/2012 Qiao ............................. 381/175
2002/0102004 A1 * 8/2002 Minervini ..................... 381/175
2006/0157841 A1 * 7/2006 Minervini ..................... 257/680
2006/0280319 A1 * 12/2006 Wang et al. ................... 381/172
2007/0071260 A1 3/2007 Mullenborn et al.
2007/0071268 A1 * 3/2007 Harney et al. ................. 381/355
2007/0087466 A1 * 4/2007 Weigold et al. ................. 438/53
2007/0201715 A1 * 8/2007 Minervini ..................... 381/355

(Continued)

FOREIGN PATENT DOCUMENTS

CN 201138866 10/2008

OTHER PUBLICATIONS

Chinese language office action mailed Jul. 31, 2012.

(Continued)

*Primary Examiner* — David Warren
*Assistant Examiner* — Christina Russell
(74) *Attorney, Agent, or Firm* — McClure, Qualey & Rodack, LLP

(57) ABSTRACT

A silicon microphone package is provided, including an integrated microphone die having opposing first and second surfaces, a first cover member formed over the first surface of the integrated microphone die to form a first chamber therebetween, and a second cover member formed over the second surface of the integrated microphone die to form a second chamber therebetween.

25 Claims, 7 Drawing Sheets

(56) References Cited

U.S. PATENT DOCUMENTS

| | | | | |
|---|---|---|---|---|
| 2008/0130935 | A1* | 6/2008 | Sato et al. | 381/361 |
| 2009/0169035 | A1* | 7/2009 | Rombach et al. | 381/175 |
| 2010/0086146 | A1* | 4/2010 | Gong et al. | 381/91 |
| 2010/0086164 | A1* | 4/2010 | Gong et al. | 381/369 |
| 2010/0111344 | A1* | 5/2010 | Sun et al. | 381/355 |
| 2010/0142744 | A1* | 6/2010 | Rombach et al. | 381/355 |
| 2010/0183181 | A1* | 7/2010 | Wang | 381/361 |
| 2010/0246877 | A1* | 9/2010 | Wang et al. | 381/361 |
| 2011/0075875 | A1* | 3/2011 | Wu et al. | 381/361 |
| 2012/0237073 | A1* | 9/2012 | Goida et al. | 381/361 |

OTHER PUBLICATIONS

English language translation of abstract of CN 201138866 (published Oct. 22, 2008).

* cited by examiner

SILICON MICROPHONE PACKAGE

CROSS REFERENCE TO RELATED APPLICATIONS

This application claims the benefit of U.S. Provisional Application No. 61/182,587 filed May 29, 2009, and the entirety of which is incorporated by reference herein.

BACKGROUND OF THE INVENTION

1. Field of the Invention

The present invention relates to microphone devices, and in particular, to silicon microphone packages.

2. Description of the Related Art

Ever since silicon microphones have been mass produced for mobile phones in 2003, microphones based on silicon semiconductor technology have been subjected to increasingly extensive research. Accordingly, annually, silicon microphones are increasing market share when compared to conventional electret condenser microphones (ECMs).

Compared to ECMs, a major advantage of silicon microphones is robustness against high temperatures and humidity. For a silicon microphone, such as a condenser silicon microphone, a microphone capacitor formed by a flexible membrane and a rigid back plate is charged by a constant potential supplied by an integrated ASIC (application-specific integrated circuit). Meanwhile, due to the ability of silicon microphones to undergo standard lead-free reflow soldering temperatures of up to 260° C., fully automated surface mount production lines may be used to manufacture silicon microphones. Accordingly, silicon microphones may be manufactured more reliably and cost less than ECMs.

Following are several disclosures concerning packaging of a silicon microphone.

U.S. Pat. No. 6,781,231 describes a microelectromechanical system package including a microelectromechanical system microphone, a substrate, and a cover. The substrate has a surface for supporting the microelectromechanical microphone. The cover includes a conductive layer having a center portion bounded by a peripheral edge portion. A housing is formed by connecting the peripheral edge portion of the cover to the substrate. The center portion of the cover is spaced apart from the surface of the substrate to accommodate the microelectromechanical system microphone. The housing includes an acoustic port to allow an acoustic signal to reach the microelectromechanical system microphone.

U.S. Pat. No. 7,434,305 describes a silicon condenser microphone package comprising a transducer unit, a substrate, and a cover. The substrate includes an upper surface having a recess formed therein. The transducer unit is attached to the upper surface of the substrate and overlaps at least a portion of the recess wherein a back volume of the transducer unit is formed between the transducer unit and the substrate. The cover is placed over the transducer unit and includes an aperture.

U.S. Pat. No. 7,439,616 discloses a silicon condenser microphone package including a transducer unit, a substrate, and a cover. The substrate includes an upper surface transducer unit, which is attached to the upper surface of the substrate and overlaps with at least a portion of the recess, wherein a back volume of the transducer unit is formed between the transducer unit and the substrate. The cover is placed over the transducer unit and either the cover or the substrate includes an aperture.

U.S. Pat. No. 7,447,323 relates to a surface mountable acoustic transducer system, comprising one or more transducers, a processing circuit electrically connected to the one or more transducers, and contact points arranged on an exterior surface part of the transducer system. The contact points are adapted to establish electrical connections between the transducer system and an external substrate. The contact points are further adapted to facilitate mounting of the transducer system on the external substrate by conventional surface mounting techniques.

U.S. Pat. Publication No. 2007/0071260 discloses a silicon-based transducer assembly coupled to a movable structure in a hearing instrument. The transducer assembly includes at least one microphone chip and an ASIC having multiple integrated components such as any combination of a DSP, an A/D converter, an amplifier, a filter, or a wireless interface. The movable structure may be a battery access door, a volume dial, a switch, or a touch pad. A protection strip can be disposed across the battery access door to prevent debris from clogging the silicon-based transducer assembly. The transducer assembly may also include an array of microphone chips to achieve adaptive beam steering or directionality. When equipped with a wireless interface, the hearing instrument wirelessly communicates with another hearing instrument or with a network.

The packaging schemes disclosed in the above U.S. patents and patent application publications provide silicon microphone packages that allow acoustic energy to contact a transducer disposed within a housing. The housing provides necessary pressure reference while at the same time protects the transducer from light, electromagnetic interference and physical damage. In principle, the packaging schemes disclosed in the above U.S. patents and patent application publications use a system-in-package method. In other words, the packaging schemes typically package two chips, that is, one silicon sensing chip and one ASIC chip in a cavity, to form the entire microphone package. To reduce negative parasitic effects, the above disclosed packaging schemes require wire bonding between the silicon sensing element and ASIC and/or the PCB substrate that supports both of those chips.

Since the silicon microphone packages formed by the system-in-package method require mounting of the silicon sensing chip and the ASIC chip onto a package substrate, wire bonding is needed to form electrical connections therebetween. The silicon microphone packages formed by the system-in-package method thus encompass both the silicon sensing chip and the ASIC chip, which hinders further miniaturization of silicon microphones.

BRIEF SUMMARY OF THE INVENTION

Accordingly, small-sized silicon microphone packages are therefore provided.

An embodiment of a silicon microphone package comprises an integrated microphone die having opposing first and second surfaces, a first cover member formed over the first surface of the integrated microphone die to form a first chamber therebetween, and a second cover member formed over the second surface of the integrated microphone die to form a second chamber therebetween.

Another embodiment of a silicon microphone package comprises an integrated microphone die having opposing first and second surfaces, wherein the integrated microphone die comprises an acoustic sensing element, and a cavity. A first cover member is formed over the first surface of the integrated microphone die to form a first chamber therebetween. An acoustic opening is formed in a portion of the first cover member to partially expose the integrated microphone die. A second cover member is formed over the second surface of the integrated microphone die to form a second chamber therebetween, wherein the second chamber contacts the cavity of the integrated microphone die.

Yet another embodiment of a silicon microphone package comprises an integrated microphone die having opposing first and second surfaces, wherein the integrated microphone die comprises an acoustic sensing element and a cavity. A first cover member is formed over the first surface of the integrated microphone die to form a first chamber therebetween. A second cover member is formed over the second surface of the integrated microphone die to form a second chamber therebetween, wherein the second chamber contacts the cavity of the integrated microphone die. An acoustic opening formed in a portion of the second cover member, partially exposes the integrated microphone die.

A detailed description is given in the following embodiments with reference to the accompanying drawings.

BRIEF DESCRIPTION OF THE DRAWINGS

The invention can be more fully understood by reading the subsequent detailed description and examples with references formed to the accompanying drawings, wherein.

DETAILED DESCRIPTION OF THE INVENTION

The following description is of the best-contemplated mode of carrying out the invention. This description is formed for the purpose of illustrating the general principles of the invention and should not be taken in a limiting sense. The scope of the invention is best determined by reference to the appended claims.

FIGS. 1-13 are schematic diagrams showing various embodiments of a silicon microphone package of the invention.

Figure 1:
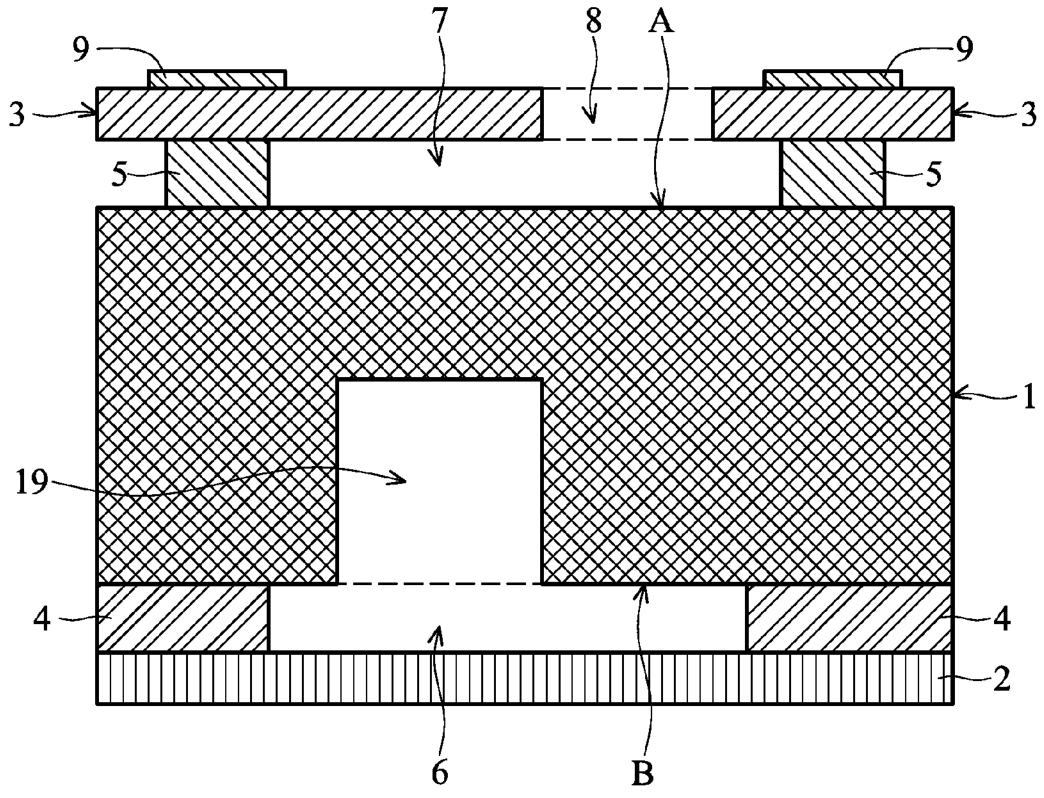
FIG. 1 is a schematic diagram showing a cross section of a silicon microphone package according to an embodiment of the invention.

FIG. 1 illustrates a cross section of an embodiment of a silicon microphone package. Herein, the silicon microphone package comprises a first cover member 2, a second cover member 3, and an integrated microphone die 1 sandwiched between the first cover member 2 and the second cover member 3. The first cover member 2 and the second cover member 3 are provided over opposing surfaces A and B of the integrated microphone die 1, respectively, such that the first cover member 2 does not physically contact the second cover member 3. In addition, the silicon microphone package shown in FIG. 1 further comprises a spacer 4 disposed between the integrated microphone die 1 and the first cover member 2, and a spacer 5 disposed between the integrated microphone die 1 and the second cover member 5. A first chamber 6 is thus formed between the first cover member 2 and the surface of the integrated microphone die 1, and a second chamber 7 is formed between the second cover member 3 and the surface B of the integrated microphone die 1. An acoustic opening 8 is formed through a portion of the second cover member 3 to allow acoustic pressure waves to pass therethrough and contact an acoustic sensing element (not shown) formed in the integrated microphone die 1. Moreover, the silicon microphone package shown in FIG. 1 further comprises a plurality of solder pads 9 provided over a surface that is not in contact with the spacer 5 of the second cover member 3 for surface mounting.

As shown in FIG. 1, the integrated microphone die 1 of the silicon microphone package is provided with a cavity 19 which is formed by a micromachining process (not shown). The spacer 4 provides an acoustic seal and electrical connections between the integrated microphone die 1 and the first cover member 2. By adjusting a thickness of the first spacer 4, a size of the first chamber 6 may become larger or smaller. Thus, a total volume obtained by combining the cavity 19 and the first chamber 6 may be adjusted. Similarly, a thickness of the spacer 5 can also be adjusted such that a volume of the second chamber 7 can be increased or decreased.

Figure 2:
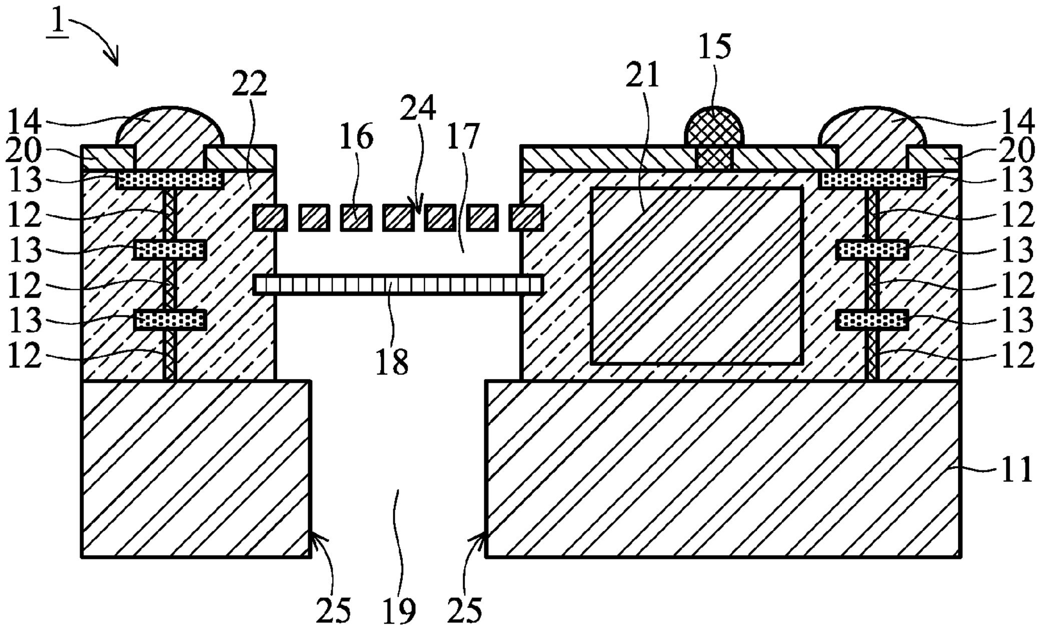
FIG. 2 is a schematic diagram showing a cross section of an integrated microphone die according to an embodiment of the invention.

FIG. 2 illustrates a cross section of an embodiment of an integrated microphone die 1 of the silicon microphone package shown in FIG. 1, comprising a silicon substrate 11 having multiple layers and components provided thereon. As shown in FIG. 2, the integrated microphone die 1 comprises a perforated member 16, a membrane 18, and a gap 17 formed between the perforated member 16 and the membrane 18. The perforated member 16 is formed with a plurality of perforation holes 24 therein. In one embodiment, the perforated member 16 is typically more rigid than the membrane 18 such that when an acoustic pressure wave impinges upon the composite structure including the perforated member 16, the air gap 17, and the membrane 18, and the acoustic pressure wave then passes through the perforation holes 24 and exerts an acoustic pressure onto the membrane 18. The membrane 18 thus vibrates under such an acoustic pressure to generate an electronic signal relative to the motion of the acoustic pressure. Both the perforated member 16 and the membrane 18 extend into a portion of a field oxide layer 22 formed on the silicon substrate 11. Thus, the perforated member 16 and the membrane 18 are suspended in a place with a relatively fixed space therebetween. The perforated member 16 and the membrane 18 may comprise conductive materials such as metal or doped semiconductor material. The perforated member 16 and the membrane 18 can also be a composite film comprising a conductive layer formed of conductive material such as metal or doped semiconductor material. Both the perforated member 16 and the membrane 18 are electrically connected to a signal conditioning circuit 21 provided in the integrated microphone die 1. A plurality of solder bumps 15 are provided over the integrated silicon die 1, passing through a passivation layer 20 which is formed and electrically connected to the signal conditioning circuit 21.

Moreover, as shown in FIG. 2, the integrated microphone die 1 further comprises a plurality of conductive vias 12 and a plurality of metal layers 13 formed in the field oxide layer 22, and one of the conductive vias 12 contacts the substrate 11. The conductive vias 12 also intersect with the metal layers 13 to provide an interconnect structure formed through the field oxide layer 22 at an edge portion of the integrated microphone die 1. A solder bump 14 is provided and sits on a topmost metal layer 13 to electrically connect the rest of the conductive vias 12 and the metal layers 13. In other words, the solder bump 14 is electrically connected to the substrate 11. During a CMOS process, the field oxide layer 22 is always formed of insulating materials. Combination of the vias 12, the metal layers 13 and the solder bump 14 thus electrically connects the substrate 11 from a top surface of the integrated microphone die 1.

The above disclosed components of the integrated microphone die 1 shown in FIG. 2 are composed of multiple layers of different materials deposited onto the silicon substrate 11 using a CMOS compatible process (not shown). The passivation layer 20 may comprise materials such as, but are not limited to, silicon nitride, silicon carbide, or silicon carbon nitride, and the field oxide layer 22 may comprise materials such as, but are not limited to, thermal oxide, or PSG. The silicon substrate 11 may comprise materials rather than silicon, such as silicon germanium or amorphous silicon. The metal layers 13 and the conductive vias 12 may comprise, but are not limited to, metals such as tungsten, aluminum, copper, titanium, and titanium nitride, or non-metallic conductive materials such as doped silicon carbide or doped silicon germanium layer.

Figure 3:
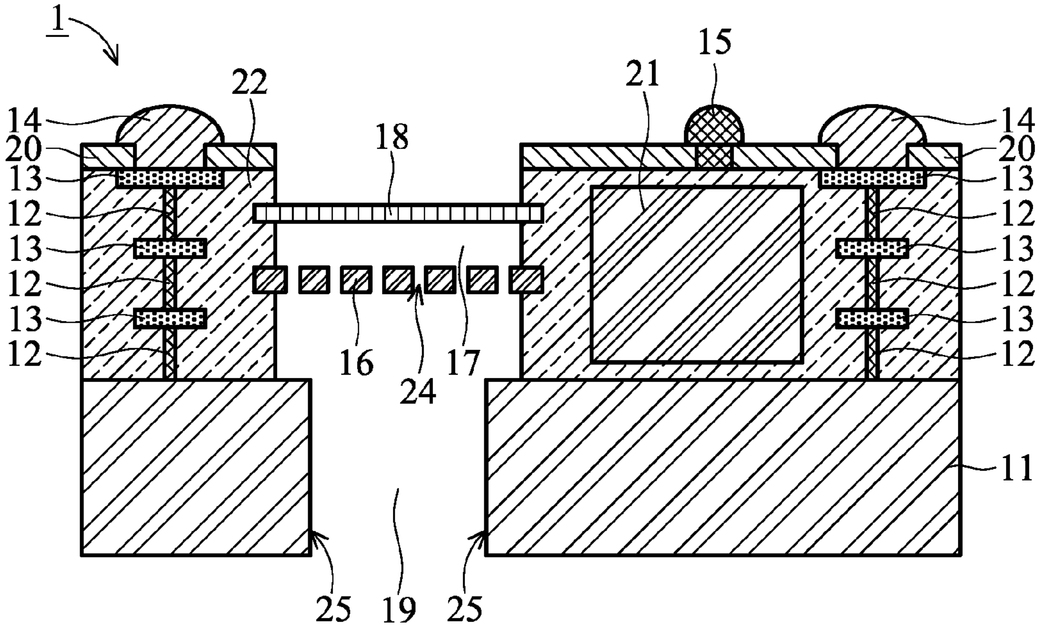
FIG. 3 is a schematic diagram showing a cross section of an integrated microphone die according to an embodiment of the invention.

FIG. 3 illustrates a cross section of another embodiment of an integrated microphone die 1. As shown in FIG. 3, the integrated microphone die 1 is similar with that illustrated in FIG. 2 except that disposition of the perforated member 16 and the membrane 18 are switched, such that acoustic pressure waves may impose acoustic pressure directly on the surface of membrane 18, if such acoustic pressure waves originates from the top of the integrated silicon die 1.

The cavity 19 of the silicon substrate 11 as shown in FIGS. 2 and 3 is formed by a micromachining process such as a deep reactive ion etching (DRIE) process. A sidewall 25 of the cavity 19 may be straight, as illustrated in the figures, or slightly slanted, depending on the tools and/or recipes used. On the other hand, a sidewall of the field oxide layer 22 may be formed by a release etch process (not shown), which may be time controlled or used in conjunction with a release stop material, such as metal, as an etch stop.

Figure 4:
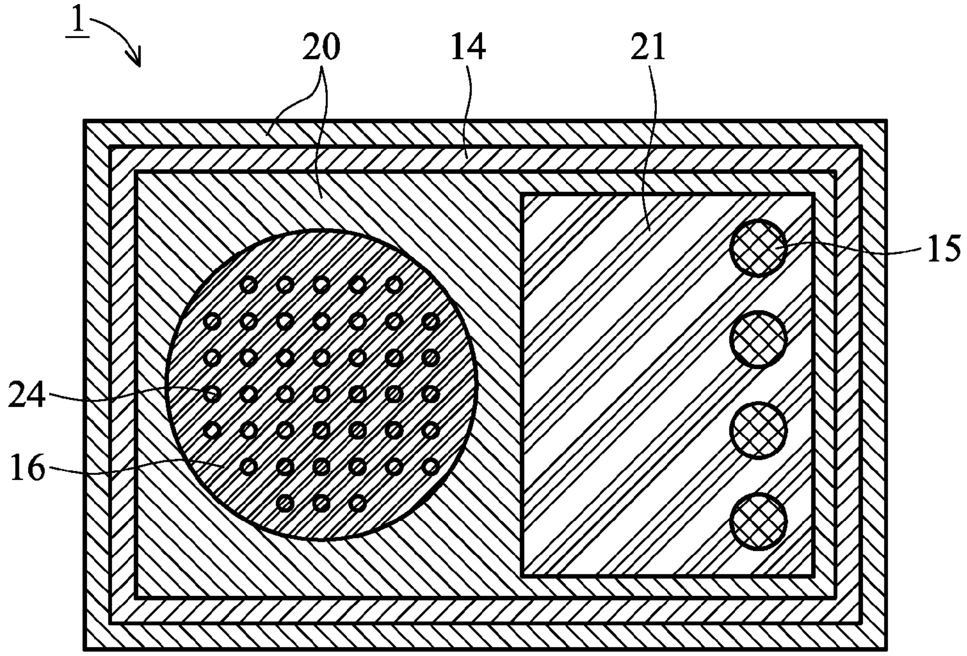
FIG. 4 is a schematic diagram showing a top view of an integrated microphone die according to an embodiment of the invention.

FIG. 4 illustrates a schematic top view of an embodiment of an integrated microphone die 1 shown in FIG. 2. For illustration purposes, the integrated microphone die 1 is shown in a rectangular shape, but is not limited thereto. The acoustic sensing element (illustrated as the perforated member 16 having a plurality of perforation holes 24) is arranged at the left side of the integrated microphone die 1, and the signal conditioning circuit 21 is arranged at the right side of the integrated microphone die 1. In practice, the signal conditioning circuit 21 may be arranged surrounding the acoustic sensing element. On the other hand, the perforated member 16 typically has a circular shape and so does the perforation holes 24. As previously described, a plurality of solder bumps 15 are arranged on a top surface of the signal conditioning circuit 21 to electrically connect the signal conditioning circuit 21 to a component (not shown) outside of the integrated microphone die 1.

In FIG. 4, the solder bump 14 is illustrated as a continuous bump formed along an edge of the integrated microphone die 1. In such an arrangement, the conductive vias 12 and the metal layers 13 underlying the solder bump are also formed as a continuous configuration such that a conductive ring inside of the field oxide layer 22 is formed. The continuous ring formed of the conductive vias 12 and the metal layers 13 are physically continuous from the solder bump 14 to the substrate 11, and from one side to the other side of the integrated microphone die 1. Since the first cover member 2 may comprise a conductive layer and the second cover member 3 may also comprise a conductive layer, the continuous via ring formed of the solder bump 14, together with silicon substrate 11, forms an enclosed shield for the acoustic sensing element and the signal conditioning circuit 21, protecting both from electromagnetic interferences.

Figure 5:
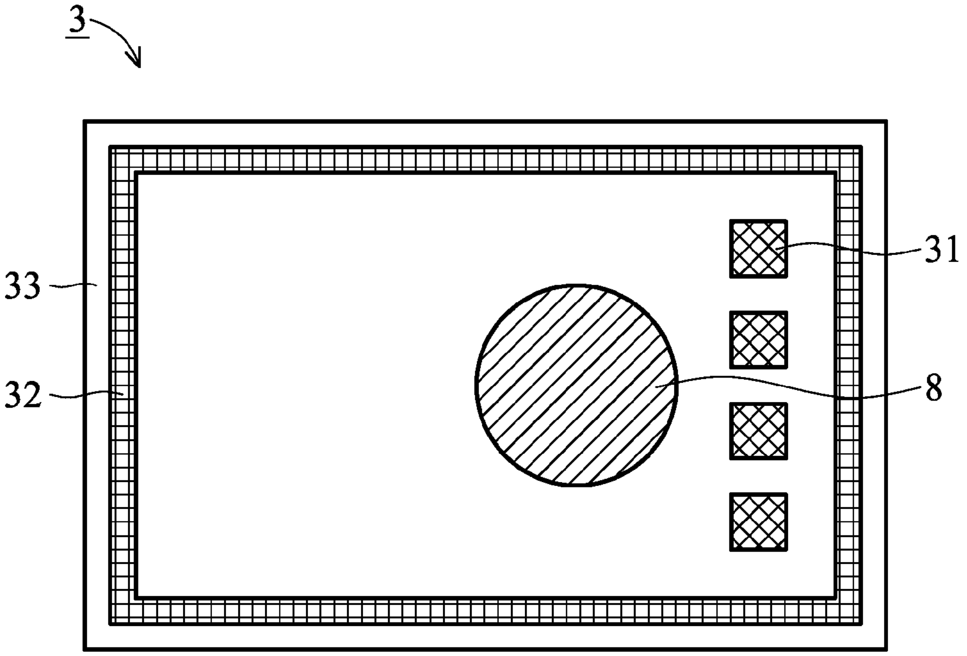
FIG. 5 is a schematic diagram showing a bottom view of a second cover member of a silicon microphone package according to an embodiment of the invention.

FIG. 5 illustrates a schematic bottom view of an embodiment of a second cover member 3. The second cover member 3 comprises an acoustic opening 8 which allows acoustic pressure waves (not shown) from the surrounding environment to pass therethrough and contact the acoustic sensing element of the integrated silicon die 1. The second cover member 3 comprises at least an insulating layer 33 formed of insulating materials such as PR-4, ceramic materials, hard plastics, Teflon, or the like. A plurality of solder pads 31 are provided on the insulating layer 33. Also, a conductive ring 32 is arranged along the edge of the second cover member 3. Disposition of the solder pads 31 and the conductive ring 32 are arranged in such a way that they match the dispositions of the solder pads 15 and solder bumps 14 formed on the integrated microphone die 1.

Therefore, when the second cover member 3 is placed on top of the integrated silicon die 1, the solder pads 15 are aligned with solder pads 31. Similarly, the solder bumps 14 are aligned with the conductive ring 32. In one embodiment, the second cover member 3 is bonded to the integrated microphone die 1 by the spacer 5 comprising electrically conductive glues or electrically conductive vias (not shown) separately embedded by an insulating layer (not shown). In the case where a conductive glue is used as the spacer 5, to fix the second cover member 3 and the integrated microphone die 1, the conductive glue may have a low thermal expansion coefficient such that when an operation temperature of an embodiment of a packaged microphone changes, the glue does not exert excessive stress on the integrated microphone die 1, thereby reducing its acoustic and electrical performance. In the case where electrically conductive vias (not shown) separately embedded by an insulating layer (not shown) are used as the spacer 5, to fix the second cover member 3 and the integrated microphone die 1, the conductive vias and the insulating layer may have a low thermal expansion coefficient such that when an operation temperature of an embodiment of a packaged microphone changes, the conductive vias and the insulating layer do not exert excessive stress on the integrated microphone die 1, thereby reducing its acoustic and electrical performance.

In another embodiment, the second cover member 3 and the integrated microphone die 1 are pre-aligned and then are bonded together in a re-flow oven. When the second cover member 3 is glued or re-flowed onto the integrated microphone die 1, an acoustic seal is established at the joint therebetween. Preferably, the acoustic seal is accomplished by joining the solder bumps 14 and conductive ring 32, thereby forming the spacer 5 disposed between the second cover member 3 and the integrated microphone die 1.

Figure 6:
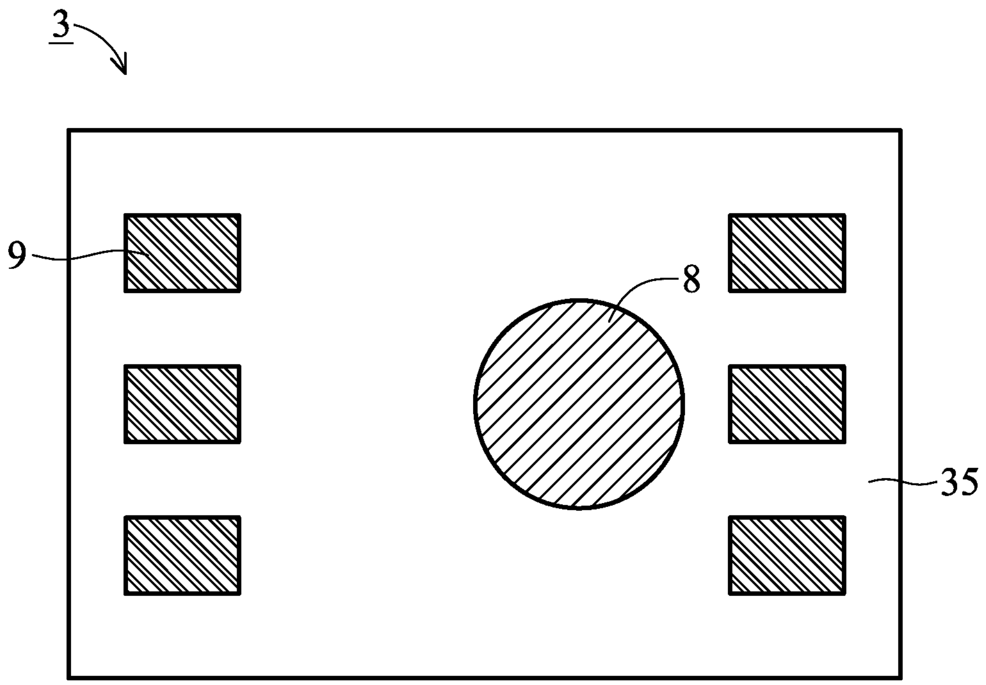
FIG. 6 is a schematic diagram showing a top view of a second cover member of a silicon microphone package according to an embodiment of the invention.

FIG. 6 illustrates a schematic top view of an embodiment of a second cover member 3. The second cover member 3 comprises a plurality of solder bumps 9 for surface mounting a silicon microphone package. The acoustic opening 8 is seen on an insulating layer 35 of the second cover member 3. Similar to the insulating layer 33, the insulating layer 35 can be formed of insulating materials such as PR-4, ceramic materials, hard plastics, Teflon, or the like. Preferably, the insulating layer 35 and the insulating layer 33 are formed of the same type of material. Further, it is preferable that the materials of the insulating layer 35 and the insulating layer 33 have similar thermo properties as the substrate 11 of the integrated microphone die 1. Specifically, the more similar the thermo properties of the materials of the insulating layer 35 and the insulating layer 33 are with the silicon substrate 11, the lower the thermally induced stress is on the integrated microphone die 1 during the packaging process and normal operation.

Figure 7:
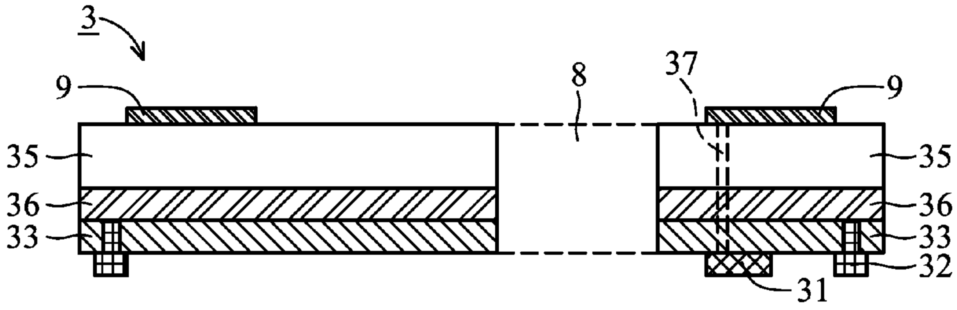
FIG. 7 is a schematic diagram showing a cross section of a second cover member of a silicon microphone package according to an embodiment of the invention.

FIG. 7 illustrates a schematic cross section of an embodiment of a second cover member 3. In one embodiment, the second cover member 3 may comprise a conductive layer 36 providing electrical shielding for a silicon microphone package from electromagnetic interferences. The second cover member 3 also comprises the insulating layer 33 and the insulating layer 35 as shown in FIGS. 5-6. As shown in FIG. 7, a conductive layer 36 is sandwiched between the insulating layers 33 and 35. An acoustic opening 8 is formed through the uppermost sandwiched structure to allow acoustic pressure waves to pass therethrough and contact the acoustic sensing element in the integrated microphone die 1. A plurality of conductive vias 37 (illustrated in dotted line) passes through the sandwich structure so that the solder bumps 31 and the solder pads 9 are electrically connectable. A cut-through on the conductive layer 36 is carefully formed such that the conductive vias 37 do not interconnect with the conductive layer 36 unless one or more of the conductive vias 37 are connected to the grounding leads of the silicon microphone package.

In another embodiment, the second cover member 3 may have a plurality of conductive layers 36 and a plurality of insulating layers 33 to form a multiple-layered stack. The different layers in the multiple-layered stack are arranged in such a way that each conductive layer 36 is sandwiched between two insulating layers 33, and each of the insulating layers 33 is sandwiched between two conductive layers 36. As in the case of a three-layered sandwich structure, such a layered stack is covered by the insulating cover layer 35 on the top, and the insulating layer 33 on the bottom.

Figure 8:
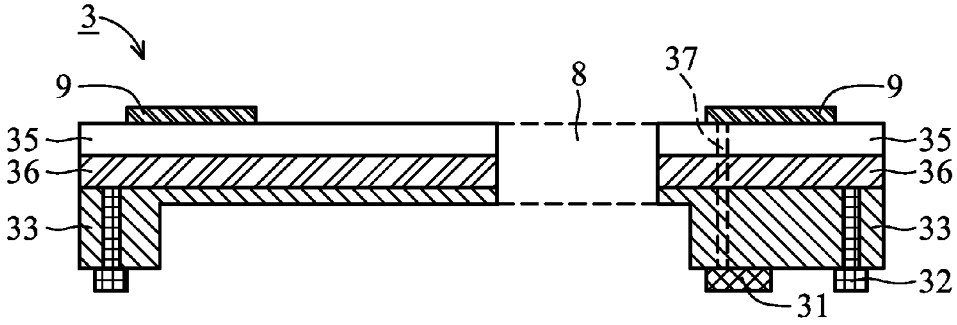
FIG. 8 is a schematic diagram showing a cross section of a second cover member of a silicon microphone package according to another embodiment of the invention.

FIG. 8 illustrates a schematic cross section of another embodiment of a second cover member 3. Herein, the second cover member 3 comprises a recess 38 formed on the insulating layer 33 and a height of the recess can be adjusted by changing a thickness of the insulating layer 33. With the recess 38, the volume of the second chamber 7 can be effectively increased. By adjusting a size of the recess 38 by either adjusting a height or a lateral dimension thereof, volume of the second chamber 7 (see FIG. 1) can be optimized to achieve desired acoustic performance for a silicon microphone package. When the recess 38 is formed in the second cover member 3, the remaining layer in the recessed region is reinforced to provide enough mechanical strength to the second cover member 3.

Figure 9:
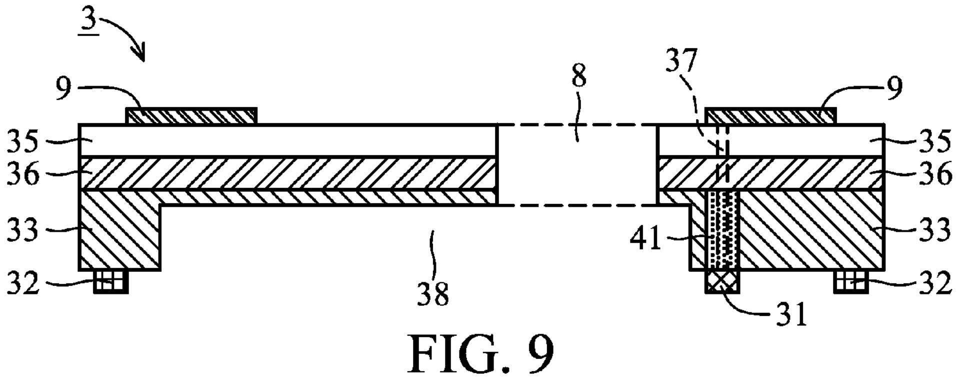
FIG. 9 is a schematic diagram showing a cross section of a second cover member of a silicon microphone package according to yet another embodiment of the invention.

FIG. 9 illustrates a schematic cross section of yet another embodiment of a second cover member 3. Herein, the second cover member 3 is formed of silicon material which is the same as that used in the integrated silicon die 1. As shown in FIG. 9, the second cover member 3 comprises a recess 38 formed on a bottom substrate 33. The height of the recess 38 can be adjusted by changing a thickness of the bottom substrate 33. With the recess 38, the volume of the second chamber 7 (see FIG. 1) may be effectively increased. By adjusting the size of the recess 38 by either adjusting a height or a lateral dimension thereof, the volume of the second chamber 7 can be optimized to achieve desired acoustic performance for a silicon microphone package. Since the bottom substrate 33 is formed of semiconductor materials such as silicon, additional isolation walls 41 are formed such that the electrical signals passing from the solder bumps 31 are not shorted by the bottom substrate 33.

Figure 10:
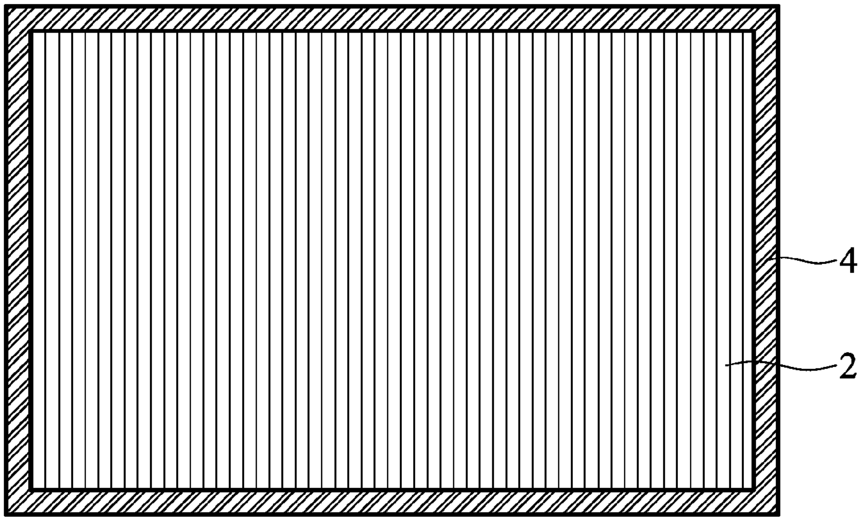
FIG. 10 is a schematic diagram showing a top view of a first cover member of a silicon microphone package according to an embodiment of the invention.

FIG. 10 illustrates a schematic top view of an embodiment of a first cover member 2. The first cover member 2 comprises a conductive ring 4 disposed at an outer edge thereof. The conductive ring 4 contacts with the silicon substrate 11 of the integrated microphone die 1. The conductive ring 4 can be formed of conductive materials such as metal or other conductive material such as conductive epoxy. The first cover member 2 may comprises conductive materials such as metal or other conductive materials such that an electrical connection is established with the silicon substrate 11 when it is attached to the integrated microphone die 1. Further, the first cover member 2 forms an acoustic seal when it is attached to the integrated microphone die 1.

In other embodiments, the first cover member 2 is formed with multiple layers comprising at least one conductive layer formed of conductive materials such as metal. This conductive layer establishes an electrical connection with the silicon substrate 11 of the integrated silicon die 1.

Figure 11:
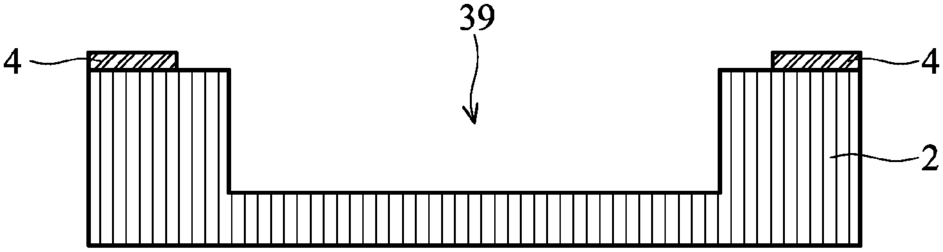
FIG. 11 is a schematic diagram showing a cross section of a first cover member of a silicon microphone package according to an embodiment of the invention.

FIG. 11 illustrates a schematic cross section of an embodiment of a first cover member 2. In this embodiment, the first cover member 2 comprises a recess 39 formed inwardly. The recess 39 effectively increases the volume of the closed cavity 6 (shown in FIG. 1). By adjusting a height of recess 39, the volume of the closed cavity 6 can be increased or decreased to achieve optimal acoustic performance as desired.

Figure 12:
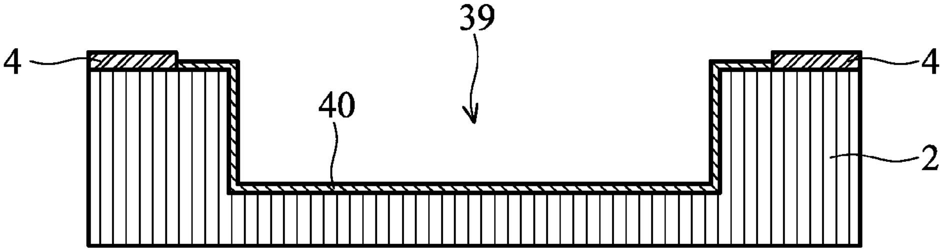
FIG. 12 is a schematic diagram showing a cross section of a first cover member of a silicon microphone package according to another embodiment of the invention.

In other embodiments, the first cover member 2 can be formed of silicon material similar to the silicon substrate 11 of the integrated microphone die 1. The first cover member 2 is thus doped to make it conductive. The first cover member 2 can be formed with a conductive layer 40 overlying a surface of the recess 39, as illustrated in FIG. 12. The conductive ring 4 can be formed of metal or other conductive materials that are either sputtered or deposited chemically or physically on the first cover member 2. The first cover member 2 is thus bonded to the silicon substrate 11 of the integrated microphone die 1 by using a eutectic bond or similar technology.

Figure 13:
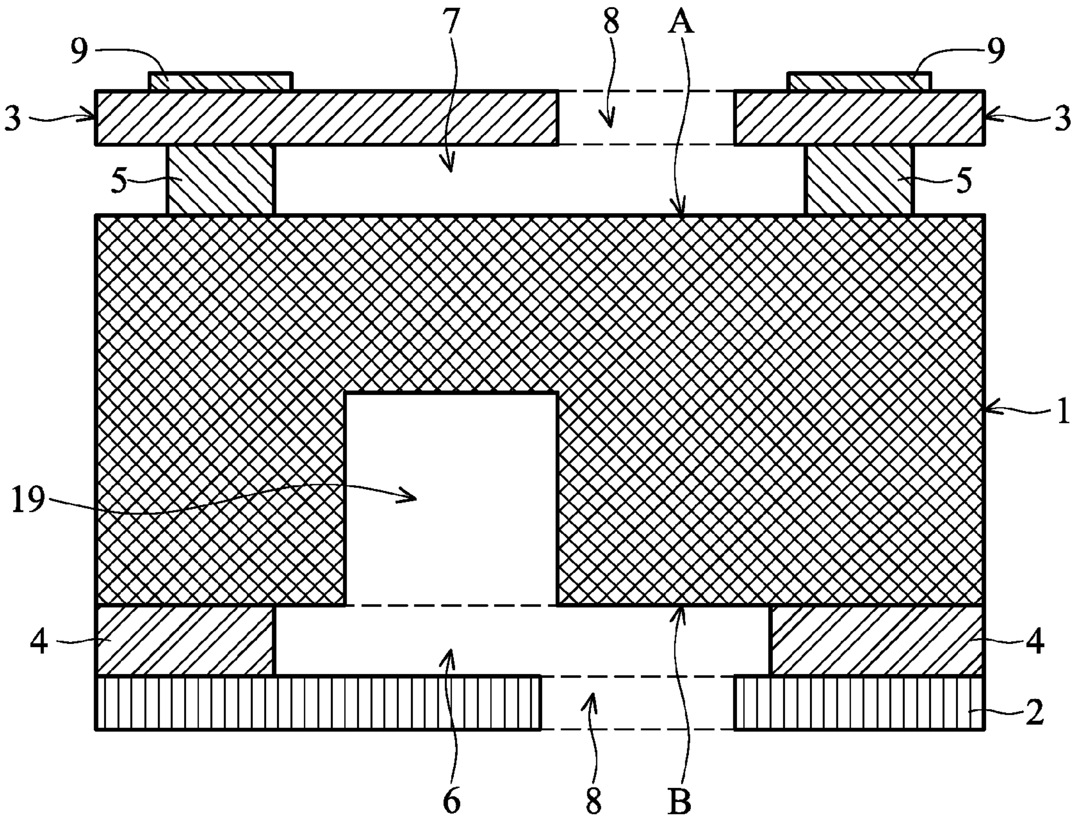
FIG. 13 is a schematic diagram showing a cross section of a silicon microphone package according to an embodiment of invention.

FIG. 13 illustrates a schematic cross section of another embodiment of a silicon microphone packaging. Herein, the silicon microphone package comprises the integrated microphone die 1 sandwiched between the first cover member 2 and the second cover member 3. The spacer 4 is placed between the integrated microphone die 1 and the first cover member 2. The acoustic opening 8 is formed in the first cover member 2 to allow acoustic pressure waves to contact an acoustic sensing element (not shown) in the integrated microphone die 1. Likewise, the spacer 5 is placed between the integrated microphone die 1 and the second cover member 5. The first chamber 6 is then formed between the first cover member 2 and one surface of the integrated microphone die 1. The second chamber 7 is also formed between the second cover members 3 from another surface of the integrated microphone die 1. A plurality soldering pads 9 are formed at the other surface that is not in contact with the spacer 5 of the second cover member 3.

As shown in FIG. 13, a cavity 19 is formed on the integrated silicon die 1 by methods such as a micromachining process. The first spacer 4 provides an acoustic seal between the integrated microphone die 1 and the first cover member 2. By adjusting a thickness of the first spacer 4, a size of the first chamber 6 can be larger or smaller. Thus, the total volume of the cavity 19 and the first chamber 6 can be adjusted. Similarly, a thickness of the second spacer 5 can also be adjusted such that the volume of the second chamber 7 can be increased or reduced to achieve an optimal acoustic performance for the silicon microphone package as shown in FIG. 13.

As shown in FIG. 1 or 13, a small-sized silicon microphone package is provided. The silicon microphone package shown in FIGS. 1 and 13 both have an open path (e.g. an opening path formed by the acoustic opening 8 and first chamber 6 or second chamber 7) to receive sound pressure and the integrated microphone die 1 therein is protected by the first cover member 2 and the second cover member 3 from external environmental hazards like particles, dust, corrosive gases and humidity. A sufficient back chamber is provided by the cavity 19 in combination with the first chamber 6, to ensure desired performance of the acoustic sensing device used in the integrated microphone die 1. Also, since the silicon microphone package is provided with solder pads 9 on exposed surfaces thereof, batch production of the silicon microphone package in large quantities can be achieved by, for example, a surface mounting process, wherein expensive package substrates and packaging materials do not have to be used.

Moreover, the integrated microphone die 1 in the silicon microphone package shown in FIGS. 1 and 13 can be formed with a monolithically integrated silicon microphone die comprising an acoustic sensing element and a signal conditioning circuit integrated into one single chip. It is therefore advantageous that no wire bonding is required in the packaging process and size of the silicon microphone can be reduced to a size which is the same as that of the integrated microphone die 1. Thus, achieving good acoustic performance without increasing costs and manufacturability. The silicon microphone package illustrated in FIGS. 1 and 13 also provides mechanical shielding from the environmental and electromagnetic interferences with the use of the first cover member 2 and the second cover member 3.

During operation, the silicon microphone packages shown in FIG. 1 or 13 allows acoustic signals to pass therethrough to the sensing element of a monolithically integrated silicon microphone (i.e. the integrated microphone die 1), effectively eliminating acoustic leakage through the side wall associated with the conventional silicon microphone package. The integrated silicon microphone die is electrically connected to the top and bottom cover members to form two acoustically interconnected front and back chambers. Since the integrated microphone die therein is sandwiched between and electrically connected to the top and bottom cover members to form a shielding against electromagnetic interferences, it is least vulnerable to temperature fluctuations during the packaging and assembly process and is easily manufactured by volume production.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A silicon microphone package, comprising:

an integrated microphone die having opposing first and second surfaces, wherein the integrated microphone die comprises an acoustic sensing element formed in the integrated microphone die and a signal conditioning circuit formed in the integrated microphone die, and the signal conditioning circuit is at a side of the acoustic sensing element;

a first cover member formed over the first surface of the integrated microphone die, forming a first chamber therebetween; and a second cover member formed over the second surface of the integrated microphone die, forming a second chamber therebetween, wherein the first and second cover members respectively comprise an enclosed conductive ring disposed around an edge portion of a surface thereof, contacting the first surface or the second surface of the integrated microphone die.

2. The silicon microphone package as claimed in claim 1, wherein the first cover member comprises a conductive layer electrically contacting the enclosed conductive ring.

3. The silicon microphone package as claimed in claim 1, wherein the second cover member comprises a conductive layer electrically contacting the enclosed conducive ring.

4. The silicon microphone package as claimed in claim 1, wherein the first cover member or the second cover member comprises an acoustic opening, wherein the acoustic opening allows acoustic waves to pass therethrough and contact the acoustic sensing element.

5. The silicon microphone package as claimed in claim 1, wherein the integrated microphone die comprise a cavity formed therein, and the cavity contacts one of the first and second chambers.

6. The silicon microphone package as claimed in claim 1, wherein the integrated microphone die comprises a continuous interconnect structure disposed around an edge portion of the integrated microphone die.

7. The silicon microphone package as claimed in claim 1, further comprising a solder pad formed over a surface of the first or second cover member not facing the integrated microphone die for surface mounting.

8. A silicon microphone package, comprising:

an integrated microphone die having opposing first and second surfaces, wherein the integrated microphone die comprises an acoustic sensing element formed in the integrated microphone die, a cavity, and a signal conditioning circuit formed in the integrated microphone die, and the signal conditioning circuit is at a side of the acoustic sensing element;

a first cover member formed over the first surface of the integrated microphone die, forming a first chamber therebetween;

an acoustic opening formed in a portion of the first cover member, partially exposing the integrated microphone die; and a second cover member formed over the second surface of the integrated microphone die, forming a second chamber therebetween, wherein the second chamber contacts the cavity of the integrated microphone die, and wherein the first and second cover members respectively comprise an enclosed conductive ring disposed around an edge portion of a surface thereof, contacting the first surface or the second surface of the integrated microphone die.

9. The silicon microphone package as claimed in claim 8, wherein the first cover member comprises a conductive layer electrically contacting the enclosed conductive ring.

10. The silicon microphone package as claimed in claim 8, wherein the second cover member comprises a conductive layer electrically contacting the enclosed conducive ring.

11. The silicon microphone package as claimed in claim 8, wherein the acoustic opening allows acoustic waves to contact the acoustic sensing element.

12. The silicon microphone package as claimed in claim 8, wherein the integrated microphone die comprises a continuous interconnect structure disposed around an edge portion of the integrated microphone die.

13. The silicon microphone package as claimed in claim 8, further comprising a solder pad formed over a surface of the first cover member not facing the integrated microphone die for surface mounting.

14. The silicon microphone package as claimed in claim 8, wherein the acoustic sensing element comprises a membrane and a perforated member with perforation holes therein.

15. The silicon microphone package as claimed in claim 14, wherein the perforated member with perforation holes therein is disposed in a location that is close to the acoustic opening.

16. The silicon microphone package as claimed in claim 14, wherein the membrane is disposed in a location that is close to the acoustic opening.

17. A silicon microphone package, comprising:

an integrated microphone die having opposing first and second surfaces, wherein the integrated microphone die comprises an acoustic sensing element formed in the integrated microphone die, a cavity, and a signal conditioning circuit formed in the integrated microphone die, and the signal conditioning circuit is at a side of the acoustic sensing element;

a first cover member formed over the first surface of the integrated microphone die, forming a first chamber therebetween;

a second cover member formed over the second surface of the integrated microphone die, forming a second chamber therebetween, wherein the second chamber contacts the cavity of the integrated microphone die; and an acoustic opening formed in a portion of the second cover member, partially exposing the integrated microphone die, wherein the first and second cover members respectively comprise an enclosed conductive ring disposed around an edge portion of a surface thereof, contacting the first surface or the second surface of the integrated microphone die.

18. The silicon microphone package as claimed in claim 17, wherein the first cover member comprises a conductive layer electrically contacting the enclosed conductive ring.

19. The silicon microphone package as claimed in claim 17, wherein the second cover member comprises a conductive layer electrically contacting the enclosed conducive ring.

20. The silicon microphone package as claimed in claim 17, wherein the acoustic opening allows acoustic waves through the cavity to contact the acoustic sensing element.

21. The silicon microphone package as claimed in claim 17, wherein the integrated microphone die comprises a continuous interconnect structure disposed around an edge portion of the integrated microphone die.

22. The silicon microphone package as claimed in claim 17, further comprising a solder pad formed over a surface of the first cover member not facing the integrated microphone die for surface mounting.

23. The silicon microphone package as claimed in claim 17, wherein the acoustic sensing element comprises a membrane and a perforated member with perforation holes therein.

24. The silicon microphone package as claimed in claim 23, wherein the perforated member with perforation holes therein is disposed in a location that is close to the cavity and the acoustic opening.

25. The silicon microphone package as claimed in claim 23, wherein the membrane is disposed in a location that is close to the cavity and the acoustic opening.

* * * * *